US008629691B2

(12) United States Patent
Fitton et al.

(10) Patent No.: US 8,629,691 B2
(45) Date of Patent: Jan. 14, 2014

(54) SYSTEMS AND METHODS FOR INTERFACING BETWEEN HARD LOGIC AND SOFT LOGIC IN A HYBRID INTEGRATED DEVICE

(75) Inventors: Michael Fitton, Menlo Park, CA (US); Kulwinder Dhanoa, Old Windsor (GB); Benjamin Thomas Cope, London (GB); Kellie Marks, Middle Park (AU); Lei Xu, High Wycombe (GB)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/474,070

(22) Filed: May 17, 2012

(65) Prior Publication Data

US 2012/0319730 A1    Dec. 20, 2012

Related U.S. Application Data

(60) Provisional application No. 61/487,046, filed on May 17, 2011.

(51) Int. Cl.
*H03K 19/177* (2006.01)
*G06F 1/26* (2006.01)

(52) U.S. Cl.
USPC .................. 326/46; 326/38; 326/47; 713/300

(58) Field of Classification Search
USPC ....................................... 326/41, 47
See application file for complete search history.

(56) References Cited

U.S. PATENT DOCUMENTS

| 6,020,755 | A  | * | 2/2000 | Andrews et al. | 326/39 |
| 7,389,487 | B1 | * | 6/2008 | Chan et al. | 716/50 |
| 7,421,605 | B2 | * | 9/2008 | Balasubramanian et al. | 713/340 |
| 7,487,376 | B2 | * | 2/2009 | Bakker et al. | 713/330 |
| 8,314,636 | B2 | * | 11/2012 | Hutton et al. | 326/41 |
| 2003/0107399 | A1 | * | 6/2003 | Bailis et al. | 326/38 |
| 2005/0041149 | A1 |   | 2/2005 | Chan et al. | |
| 2005/0183042 | A1 |   | 8/2005 | Vogel et al. | |
| 2010/0207659 | A1 |   | 8/2010 | Hutton et al. | |

* cited by examiner

*Primary Examiner* — Shawki S Ismail
*Assistant Examiner* — Nelson Correa
(74) *Attorney, Agent, or Firm* — Ropes & Gray LLP

(57) ABSTRACT

Systems and methods are disclosed for interfacing between hard logic elements and soft logic elements implemented on an integrated device. In particular, a configurable interface is provided that includes interconnects between hard logic and soft logic, which enable signals to be selectively routed between the inputs and outputs of hard logic blocks and soft logic modules. The interconnects allow for certain hard logic blocks to be bypassed in favor of soft logic functionality. Moreover, the interconnects allow soft logic to augment the processing of hard logic blocks, e.g., by providing additional signals to the hard logic block.

19 Claims, 9 Drawing Sheets

SYSTEMS AND METHODS FOR INTERFACING BETWEEN HARD LOGIC AND SOFT LOGIC IN A HYBRID INTEGRATED DEVICE

CROSS REFERENCE TO RELATED APPLICATION

This claims the benefit of, and priority to, commonly-assigned United States Provisional Patent Application No. 61/487,046, filed May 17, 2011, which is hereby incorporated by reference herein in its entirety.

BACKGROUND

Programmable devices are well known. Generally, programmable devices, such as field programmable gate arrays ("FPGAs"), contain numerous soft logic elements that are configurable into logic blocks that implement customized functions. FPGAs offer a low-cost and flexible solution for customers desiring to implement their own functional modules. However, FPGAs generally run slower than, and require more power and a larger area compared to, hard logic solutions such as application specific integrated devices ("ASICs"). ASICs, on the other hand, are not programmable and therefore provide less flexibility to customers desiring to customize hardware after fabrication.

As such, hybrid devices have emerged that include both hard logic and soft logic. The hard logic usually implements standard functional blocks, likely to be used in a variety of applications, while the soft logic enables customized functionality. However, these devices are limited in function and flexibility. Specifically, hard logic blocks often operate in serial fashion, and there may be no opportunity to bypass individual blocks in favor of soft logic. Additionally, hard logic blocks largely operate in isolation, such that the internal functionality of individual hard logic blocks cannot be augmented with soft logic features. Accordingly, these hybrid devices still require customers to forgo the speed and low-power advantages of hard logic whenever the flexibility afforded by soft logic is desired.

SUMMARY OF THE INVENTION

The present invention relates to systems and methods for interfacing between hard logic elements and soft logic elements implemented on a hybrid integrated device. In particular, configurable interconnects are provided between hard logic and soft logic, which enable signals to be routed between the inputs and outputs of hard logic blocks and soft logic modules. The interconnects allow for certain hard logic blocks to be bypassed in favor of soft logic functionality. Moreover, the interconnects allow soft logic to augment the processing of hard logic blocks, e.g., by providing additional signals to the hard logic block.

In accordance with embodiments of the present invention, there is provided an integrated device with a hard logic portion, a field programmable gate array ("FPGA") fabric, and an interface configured to route signals between the hard logic portion and the FPGA fabric. The hard logic portion includes a number of serially connected hard logic blocks, while the FPGA fabric includes control logic and a number of soft logic modules. The interface may be configured, in response to a control signal from the control logic, to selectively connect a node in the hard logic portion (e.g., a node in the hard logic data path) to one of the soft logic modules or one of the hard logic blocks.

In accordance with additional embodiments of the present invention, the first node may be an input to a second hard logic block. Accordingly, the interface may include a multiplexer disposed in the hard logic portion between the two hard logic blocks. The multiplexer may be configured to provide an output of the soft logic module to the input of the second hard logic block when the control signal has a first value (i.e., a bit value of 1 or 0), and an output of the first hard logic block to the second hard logic block when the control signal has a second value.

The soft logic module may be configured to receive an input signal from the first hard logic block or from another block upstream in the data path. In some approaches, both the soft logic module and the first hard logic block are configured to receive the same input signal. In addition, the control logic may be configured to power off the first hard logic block when the output of the soft logic module is selected for output by the multiplexer.

In some embodiments, the interface includes a combiner circuit and a number of multiplexers disposed in the hard logic portion. A first multiplexer may be configured to provide a data signal (e.g., provided by the first hard logic block) or a zero value to the combiner circuit based on the control signal. A second multiplexer may similarly be configured to provide a second data signal (e.g., provided by the soft logic block) and a zero value to the combiner circuit based on the control signal. The combiner circuit may be configured to combine the signals provided by the two multiplexers and to output the combined signal at the aforementioned node in the hard logic portion.

In one approach, the control logic may determine (e.g., based on stored configuration data) that the first hard logic block is to be used alone. The control logic may accordingly configure the first multiplexer to provide the data signal provided by the first hard logic block to the combiner circuit. At the same time, the control logic may configure the second multiplexer to provide the zero value to the combiner circuit. The combiner circuit may, in turn, be configured to combine the data signal with the zero value, thereby effectively outputting the original data signal provided by the first hard logic block.

In another approach, the control logic may determine (e.g., based on stored configuration data) that the first soft logic module is to be used alone. The control logic may accordingly configure the first multiplexer to provide a zero value to the combiner circuit, while configuring the second multiplexer to provide the second data signal (e.g., provided by the soft logic block) to the combiner circuit. The combiner circuit may be configured to combine the second data signal with the zero value, thereby effectively outputting the original second data signal provided by the soft logic block.

In still another approach, the control logic may determine (e.g., based on stored configuration data) that the first hard logic block and the first soft logic module are to be used together. The control logic may accordingly configure the first and second multiplexers to provide, respectively, the first and second data signals to the combiner circuit. The combiner circuit may be configured to combine the two data signals for output (e.g. with a logical addition operation).

In some embodiments, the interface includes one or more configurable delay lines disposed in the hard logic portion. A first configurable delay line may be configured to delay an input signal and to provide the delayed input signal to the soft logic module. A second configurable delay line may be configured to delay an output signal of a third multiplexer, and to provide the delayed output signal to a fourth and fifth multiplexer. In that scenario, the third multiplexer may be configured to provide the first data signal or the second data signal to the second configurable delay line based on the control signal. Additionally, the fourth multiplexer may be configured to provide the first data signal or the delayed output signal to the first multiplexer based on a delay control signal, while the fifth multiplexer is configured to provide the second data signal or the delayed output signal to the second multiplexer based on the delay control signal.

In some embodiments, the integrated device includes a processor subsystem having one or more microprocessor cores. A configuration interface may be disposed in the hard logic portion and coupled to each of the hard logic blocks. The configuration interface may be configured to provide configuration signals to the hard logic blocks based on parameters received from configuration logic in the FPGA fabric and/or the processor subsystem.

In some embodiments, the integrated device includes a debugging interface disposed in the hard logic portion. The debugging interface may be configured to insert and extract test signals at certain probe points in a data-path encompassing the hard logic blocks based on test data stored in an external memory. The external memory may be accessed by a memory controller implemented in the FPGA fabric or the processor subsystem.

Methods of configuring and operating the above-described integrated devices are also provided.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

Systems and methods are described herein for interfacing between hard logic and soft logic in a hybrid integrated device. In particular, configurable interconnects are provided between hard logic and soft logic, which enable signals to be routed between the inputs and outputs of hard logic blocks and soft logic modules. The interconnects allow for certain hard logic blocks to be bypassed in favor of soft logic functionality. Moreover, the interconnects allow soft logic to augment the processing of hard logic blocks, e.g., by providing additional signals to the hard logic block, e.g., for combination with existing signals. They hybrid device may be a single integrated chip or, in other embodiments, it may be a non-monolithic integration of two or more chips (e.g., two die in the same package).

Figure 1:
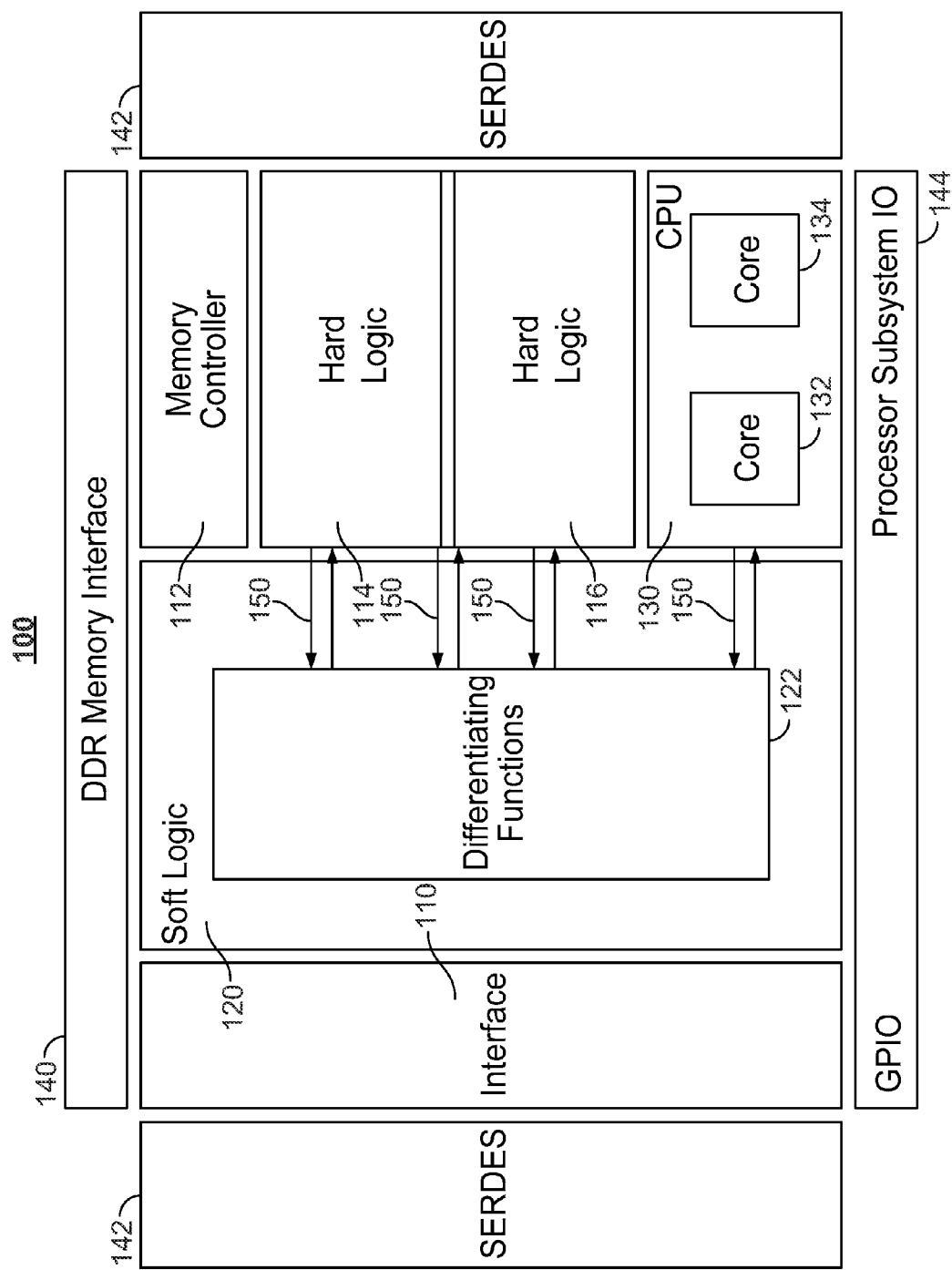
FIG. 1 depicts an illustrative hybrid device with a hard logic portion and an FPGA fabric, according to an illustrative embodiment of the present invention.

FIG. 1 shows illustrative hybrid device 100 that includes hard logic, soft logic, a microprocessor subsystem, and interface circuitry in accordance with some embodiments of the present invention. The hard logic includes interface 110, memory controller 112, and hard logic portions 114 and 116. Interface 110 contains hard logic elements for interfacing with external components (e.g., an antenna interface) through serializer-deserializer (SERDES) circuitry 142. Memory controller 112 contains hard logic elements for controlling accesses (i.e., reads and writes) to an external memory through interface 140. Hard logic portions 114 and 116 contain hard logic elements—which may be aggregated into hard logic blocks—for processing input signals. For example, hard logic portions 114 and 116 may implement transceiver functions, such as crest factor reduction, digital pre-distortion, equalization, filtering, and/or analog-to-digital conversion interface. Hard logic may interface with external components, e.g., data converters, through SERDES circuitry 142.

The soft logic includes FPGA fabric 120 having numerous programmable logic elements—which may be aggregated into soft logic modules—for processing input signals. The FPGA fabric 120 may also implement transceiver functions, with the added benefit that these functions are customer programmable. These customized soft logic modules are represented in FIG. 1 by block 122. In some cases, soft logic modules may be used to replace functions implemented in hard logic portions 114 and 116. In other cases, soft logic modules may be used to produce an input into the functions implemented in hard logic portions 114 and 116. FPGA fabric 120 may interface with hard logic portions 114 and 116 through customizable interconnects 150. As will be explained further below, interconnects 150 may be configured by control circuitry in the FPGA (i.e., implemented in FPGA fabric 120) to bypass certain hard logic blocks or to provide an input from the soft logic to one or more hard logic blocks, or visa versa.

The microprocessor subsystem 130 includes one or more processor cores, e.g., cores 132 and 134. For example, microprocessor subsystem 130 may be a system-on-chip (SoC) with a dual-core processor. The microprocessor subsystem 130 may interface with other parts of the device, or with external components, using processor subsystem IO 144.

It should be understood that the structure of device 100 is only exemplary, and that any suitable architecture may be used to implement a hybrid device with both hard logic and soft logic. It should be further understood that the hard logic portion contains hard logic blocks implementing functions—e.g., application specific standard product (ASSP) functions—that enable a very low power solution for functions that do not require customization (also referred to as "differentiation"). When flexibility and differentiation are required, however, configurable interconnects (e.g., high-bandwidth connections into the hard logic and microprocessor subsystem) enable the hard logic to interface with the FPGA fabric. Thus, the combination of hard logic, soft logic, and configurable interconnects provides a cost effective, power efficient, and flexible solution.

In an embodiment, hard logic portions 114 and 116 are implemented using a 28 nm geometry process that enables operation at a frequency of 491 Mhz. Each interconnect may be a double data width bus interface, allowing data to be transferred to and from the FPGA fabric 120 at identified points in a chain of hard logic blocks. As discussed above, the FPGA fabric can be used to implement differentiating functionality or to extend the current functionality provided by the hard logic portion. In an embodiment, the FPGA fabric 120 is implemented using a 28 nm low power process that can support up to 245 Msps at one sample per clock cycle. Higher sample rates can be supported, for example, using super sample rate implementations. Of course, the above frequencies are exemplary only, and the techniques described herein can be used in relation to devices operating at lower or higher frequencies. Additionally, it should be understood that the hard logic portion and soft logic portion may operate at the same frequency or at different frequencies.

Figure 2:
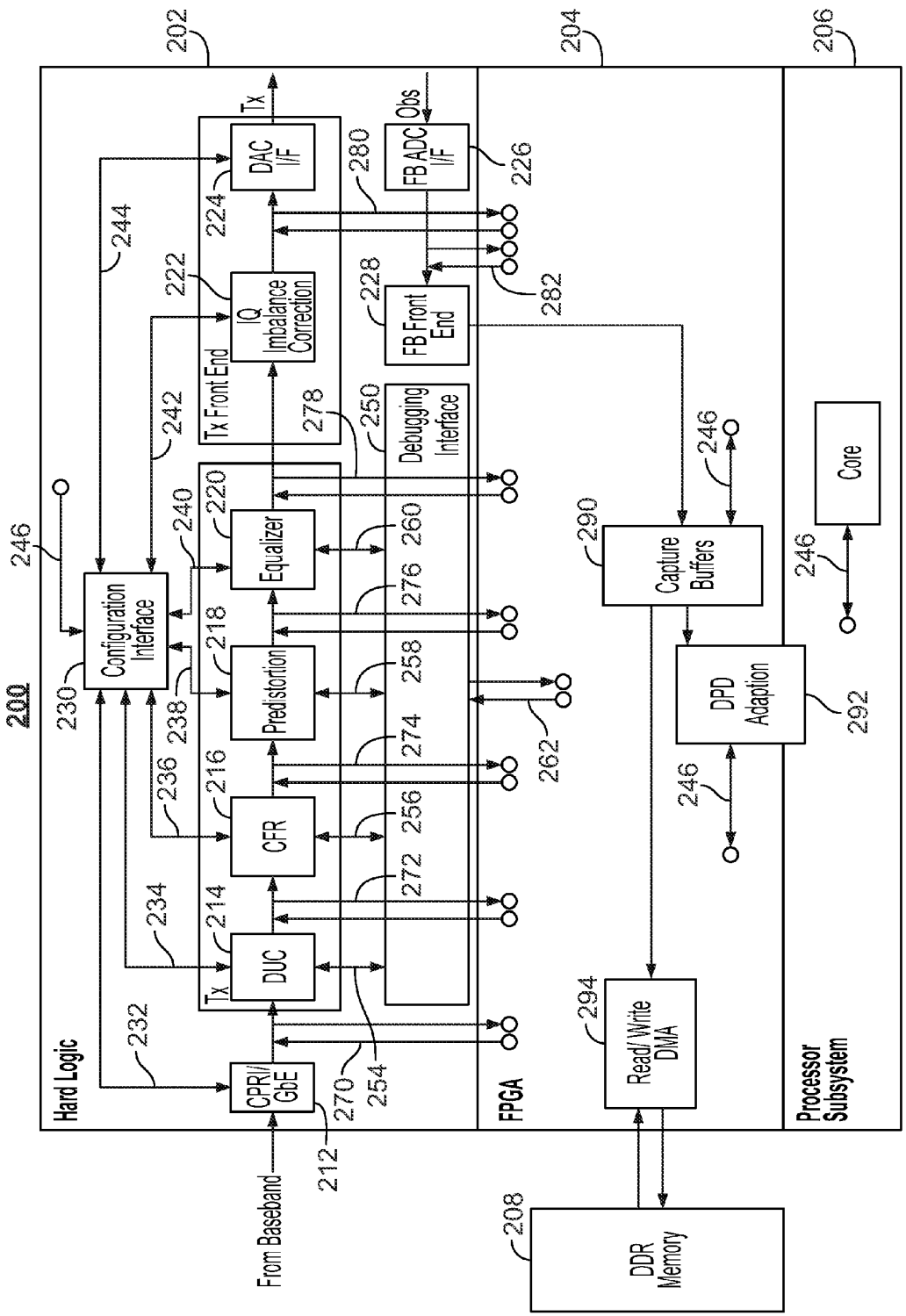
FIG. 2 depicts the major functional blocks of a hybrid device, according to an illustrative embodiment of the present invention.

FIG. 2 depicts the major functional blocks of a hybrid device in accordance with some embodiments of the present invention. In particular, FIG. 2 shows illustrative hybrid device 200, which may be substantially similar to device 100 of FIG. 1. As shown, device 200 includes hard logic 202, FPGA fabric 204, and microprocessor subsystem 206, which may be substantially similar to hard logic portions 114 and/or 116, FPGA fabric 120, and microprocessor subsystem 130 of FIG. 1, respectively. In an embodiment, device 200 interfaces with external memory 208, e.g., a double data rate (DDR) memory, through a direct memory access (DMA) controller 294 implemented within the soft logic of FPGA fabric 204.

Hard logic 202 implements any of a number of functions. In the transceiver context, hard logic 202 may implement various standard digital radio functions. As an example, FIG. 2 shows hard logic blocks that may be included in a transmitter front-end. Specifically, hard logic 202 may include network interface (e.g., Common Public Radio Interface (CPRI) or Gigabit Ethernet (GbE)) block 212, Digital Up Conversion (DUC) block 214, crest-factor reduction (CFR) block 216, digital pre-distortion (DPD) block 218, equalizer block 220, IQ imbalance correction block 222, and/or digital-to-analog conversion (DAC) interface 224. Hard logic 202 may also include DPD feedback (FB) analog-to-digital conversion (ADC) interface 226, FB front-end 228, configuration interface 230, and/or debugging interface 250.

Blocks 212-224 may be connected to each other serially, with the output of one block connected to the input of the next block, as shown. It should be understood that blocks 212-224 are exemplary only, and that, in some embodiments, one or more of blocks 212-224 may be absent and/or one or more other functional blocks (not depicted) may be included. Additionally, the order of blocks 212-224 is exemplary only, and it should be understood that blocks 212-224 can be arranged in any suitable order. In some embodiments, additional parallel paths of functional blocks may be implemented in hard logic 202. Thus, hard logic 202 may include any number of serial chains of hard logic blocks (e.g., for performing functions of a receiver or transmitter front end) connected in any suitable order.

Hard logic 202 may include configuration interface 230, which enables control logic in the FPGA fabric 204 and/or microprocessor subsystem 206 to provide configuration signals to hard logic blocks 212-224. Specifically, in an embodiment, configuration interface 230 provides a unified memory-mapped configuration bus that can be connected to the FPGA fabric 204 and/or microprocessor subsystem 206 through interconnect 246, as shown. Configuration interface 230 thus receives signals from the FPGA fabric or microprocessor subsystem and, in turn, generates configuration signals that are provided to each of blocks 212-224 via connections 232-244, respectively. It should be understood that configuration interface 230 may be any suitable type of unified interface and, in some embodiments, may not be memory-mapped.

In some embodiments, the configuration interface 230 is controlled by a soft processor and/or state machine implemented in the FPGA fabric. The configuration interface also supports configuration from an external processor, e.g., the microprocessor subsystem 206. The soft logic or microprocessor may provide configuration signals to the memory mapped configuration interface in hard logic, which may configure the relevant hard logic blocks in turn. In an embodiment, the memory mapped interface includes a 32-bit port (e.g., interconnect 246) operating at, e.g., 245 MHz.

Hard logic 202 may also include debugging interface 250, which enables insertion or extraction of data from pre-defined probe points in any of the hard logic blocks. In some embodiments, only some of hard blocks 212-224 may be connected to debugging interface 250, e.g., hard logic blocks 212-220 (as shown). Specifically, each of hard blocks 212-220 is coupled to debugging interface 250 via connections 254-260, respectively. Debugging interface 250, in turn, is connected to FPGA fabric 204 via interconnects 262, which may provide the data to external memory, as described in greater detail below in connection with FIG. 4. It should be understood that any or all of hard blocks 212-224 may be connected to debugging interface 250. However, a subset of the hard blocks may be connected when the bandwidth between hard logic 202 and soft logic 204 is limited, e.g., by physical silicon constraints. Moreover, in some embodiments, interconnects 270-282 may be used in addition to connections 254-260 for debugging and testing purposes. In yet other embodiments, the connections 254-260 may be shared amongst the hard logic blocks using configurable selection circuitry (e.g., one or more multiplexers) and/or using time domain multiplexing (e.g., time division multiplexing). The multiplexing functionality may be configured when the device is powered up, e.g., using the FPGA bit stream, or dynamically during runtime.

Referring again to FIG. 2, soft logic 204 implements any of a number of programmable functions. As an example, FIG. 2 shows soft logic blocks that may be included to support a transceiver front-end. Specifically, soft logic 204 may include capture buffers 290, digital pre-distortion (DPD) adaptation block 292, and read/write direct memory access (DMA) controller 294. Soft logic blocks 290-294 may be connected to each other as shown, or in any other suitable configuration. It should also be understood that blocks 290-294 are exemplary only, and that, in some embodiments, one or more of blocks 290-294 may be absent and/or one or more other soft blocks (not depicted) may be implemented. In sum, soft logic 204 may include any number of serial or parallel chains of soft logic blocks (e.g., for performing functions of a receiver or transmitter front end) connected in any suitable order to each other and/or to the hard logic blocks of hard logic 202.

Device 200 also includes configurable interconnects for coupling hard logic 202 to FPGA fabric 204. As shown in FIG. 2, interconnects 270-282 may be provided, each disposed at a point between two sequential hard logic blocks. This arrangement allows a data signal to be routed from any first point in the chain of hard logic blocks to the programmable logic in the FPGA fabric, and back to any second point in the chain of hard logic blocks. Alternatively, one or more of interconnects 270-282 may be disposed at a point within one of the hard logic blocks. This arrangement allows a data signal to be routed from any first point in a particular hard logic block to the programmable logic in the FPGA fabric, and back to any second point within the same or another hard logic block. Of course, a combination of these arrangements is also possible, i.e., the interconnects may allow a signal to be routed from any first point in the chain of hard logic points (whether within a block or at a node in the chain) to any other point. Thus, the routing feature enables hard logic bypassing, hard logic augmentation, and the addition of logic functions.

Hard logic bypassing is implemented by routing a signal around one or more hard logic blocks, in some cases replacing the bypassed hard logic block with a customized version in the FPGA fabric. For example, if the functionality of block 216 is not needed, interconnects 272 may be configured to route the data signal from the output of block 214 to the FPGA fabric 204, where the signal may be passed directly to interconnects 274, which may be configured to route the data signal to the input of block 218. As another example, if the functionality of block 216 is to be replaced by a soft logic module, interconnects 272 may be configured to route the data signal from the output of block 214 to the FPGA fabric 204, where the signal may be processed by a soft logic module and output to interconnects 274, which may be configured to route the data signal to the input of block 218. Bypassing and/or replacing hard logic blocks using configurable interconnects is discussed in greater detail below in connection with FIGS. 3 and 7.

Hard logic augmentation is implemented by routing a signal from a soft logic block in FPGA fabric 204 to an input of a hard logic block (or a logic element within the hard logic block). Specifically, a hard logic block may accept multiple inputs for processing, and one of those inputs may be provided by soft logic, thus augmenting the functionality of the hard logic block. The signal provided by the soft logic may or may not be derived from a data signal in the hard logic path. For example, interconnects 274 may provide an input signal from FPGA fabric 204 into pre-distortion block 218, which may be configured to accept multiple inputs. The input signal may be produced by a soft logic block that generates a new signal, or by a soft logic block that processes a signal, e.g., received from interconnects at another point in the hard logic chain.

The addition of logic functions is achieved by routing a signal from a point in the hard logic chain to a soft logic block in the FPGA fabric, and back to the same point in the hard logic chain. Thus, the soft logic block is "inserted" into the hard logic path. For example, an additional logic block may be inserted between blocks 214 and 216 by configuring interconnects 272 to route a signal from the output of block 214 to a soft logic block implemented in FPGA fabric 204, where it is processed and routed back to the input of block 216. Hard logic augmentation and the addition of logic functions are discussed in greater detail below in connection with FIGS. 3, 6 and 7.

As discussed above and depicted in FIG. 2, each of interconnects 270-282 may be disposed at a point between two sequential hard logic blocks. More generally, interconnects may be connected to any number of nodes in the hard logic data path (e.g., between hard logic blocks and/or within those blocks). It should be understood, however, that this arrangement may be conceptual in nature. Specifically, the number of nodes may be greater than the number of available interconnects. This may be the case, for example, in bandwidth-limited systems. Accordingly, the available interconnects may be selectively connected to the nodes in the hard logic data path using selection circuitry (e.g., one or more multiplexers). The selection circuitry may be configured to connect particular nodes with the available interconnects according to configuration data (e.g., by control logic in the FPGA, the microprocessor subsystem, or by the FPGA bit stream when the device is powered on). In this manner, a limited number of interconnects may be connected to any of the nodes in the hard logic data path based on the configuration data.

Figure 3:
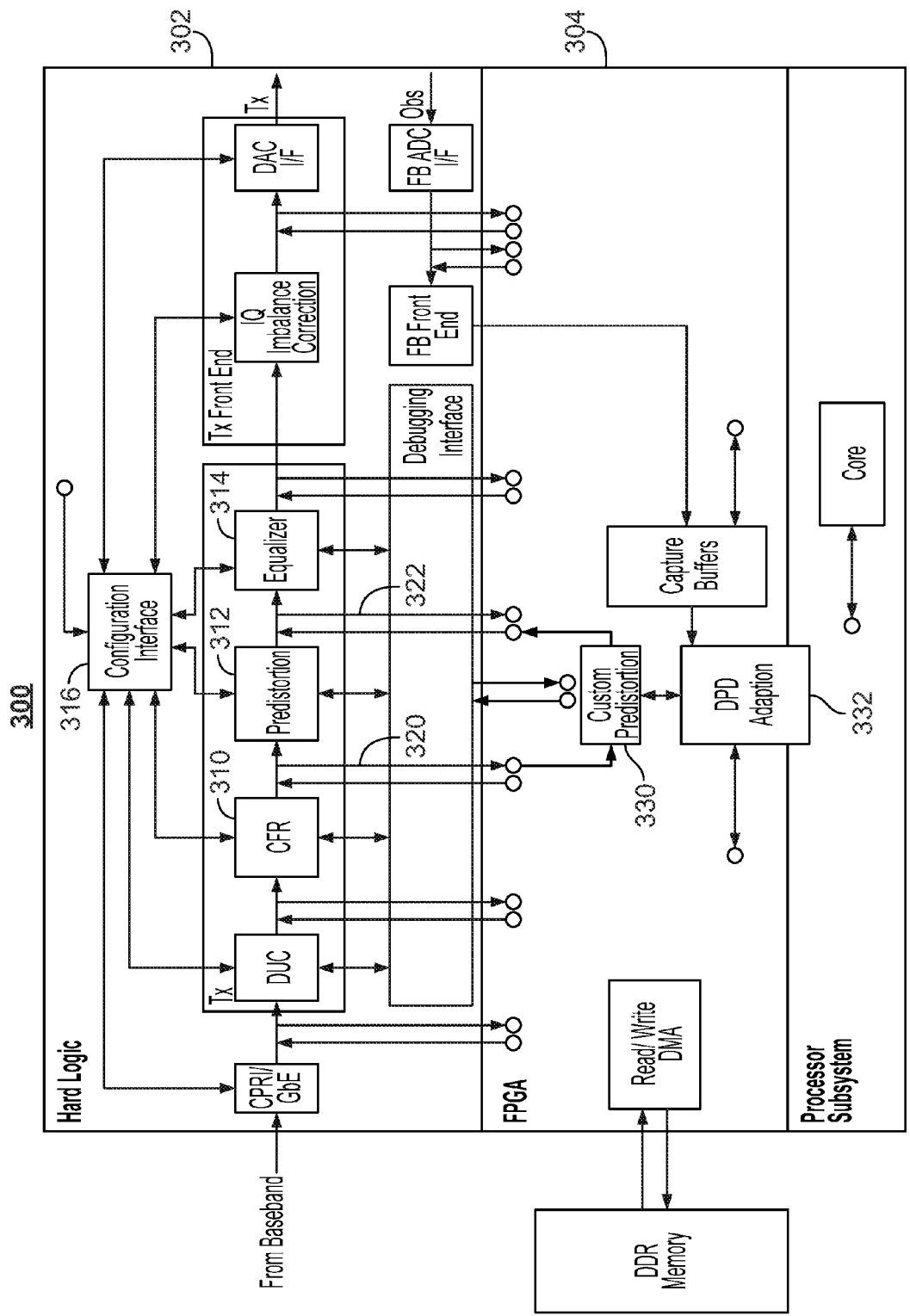
FIG. 3 depicts an exemplary implementation of a hybrid device configured to replace a hard logic block with a soft logic module, according to an illustrative embodiment of the present invention.

FIG. 3 depicts an exemplary implementation of device 200 of FIG. 2 configured to replace a hard logic block with an alternative soft logic module, in accordance with some embodiments of the present invention. In particular, FIG. 3 shows illustrative hybrid device 300, which may be substantially similar to device 200 of FIG. 2 but with the addition of custom pre-distortion block 330 in the FPGA fabric 304. As shown, interconnects 320 may be configured to route the output of hard logic block 310 to soft logic module 330. Interconnects 322 may, in turn, be configured to route the output of soft logic module 330 to the input of hard logic block 314. Thus, the functionality of hard logic block 312 is replaced with the functionality of soft logic module 330. In this manner, a customer can program the FPGA fabric 304 to implement a customized function to replace any of the hard logic blocks in hard logic 302. Furthermore, in some embodiments, control logic in FPGA fabric 304 may be configured to disable the bypassed hard logic device when an alternative soft logic block is used instead. For example, the control logic may provide a signal to configuration interface 316, which may provide a configuration signal that disables block 312 (or that prevents or minimizes power consumption of the block).

Figure 4:
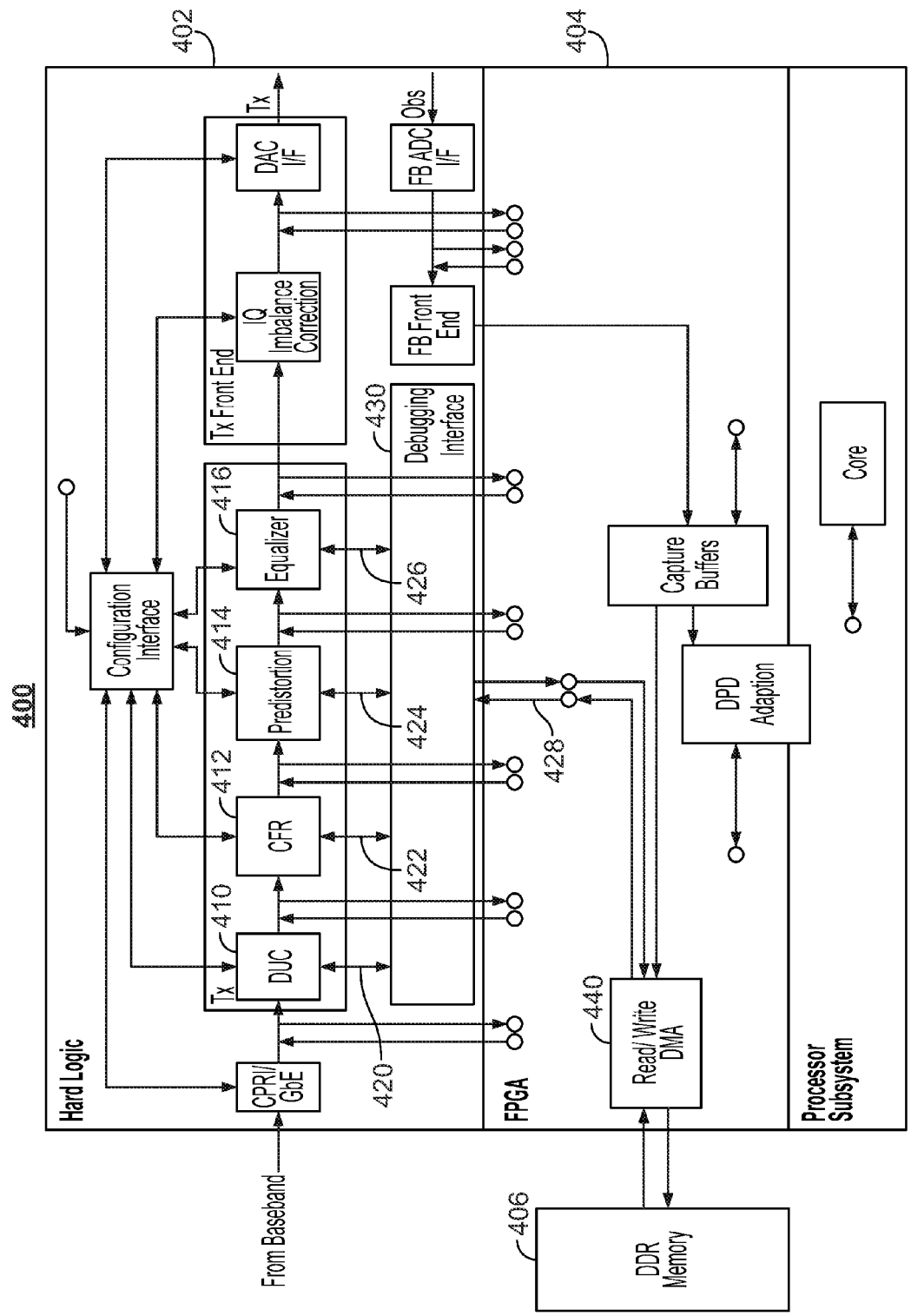
FIG. 4 depicts an exemplary implementation of a hybrid device configured to test one or more hard logic blocks, according to an illustrative embodiment of the present invention.

FIG. 4 depicts an exemplary implementation of device 200 of FIG. 2 configured to test one or more hard logic blocks, in accordance with some embodiments of the present invention. In particular, FIG. 4 shows illustrative hybrid device 400, which may be substantially similar to device 200 of FIG. 2 but with interconnects 428 coupled directly to DMA controller 440. As shown, interconnects 428 may be configured to route signals provided by debugging interface 430 to controller 440 for storage in memory 406. Debugging interface 430 enables insertion or extraction of data (e.g., for test purposes) from pre-defined probe points in any of the hard logic blocks. In some embodiments, only some of hard blocks 212-224 may be connected to debugging interface 250, e.g., hard logic blocks 212-220 (as shown). Connections 420-426 in hard logic 402 route signals at the predefined probe points to debugging interface 430, while interconnections 428 route signals from debugging interface 430 to the FPGA fabric 404. In some embodiments, interconnects 428 make up a single 32-bit bidirectional test port, thereby providing a unified debugging interface. Debugging interface 430 may be supplemented, in some embodiments, with additional debugging logic in the FPGA fabric. In such an embodiment, interconnects 428 may be configured to route signals from the debugging interface 428 to the debugging soft logic, which may then interface with memory through DMA 440.

Using interconnects 428, debugging interface 430, and connections 420-426 in the manner described above allows test data to be retrieved from memory 406 and inserted into the hard logic data path at any of the predefined probe points.

At the same time, data may be extracted at any of the predefined probe point and stored in memory 406. Insertion and collection of test data at the different probe points may assist in testing and debugging the hard logic blocks of hard logic 402. It should be understood that the debugging features may also be used when soft logic replaces or augments any of the hard logic blocks. For example, the interconnections depicted in FIGS. 3 and 4 may simultaneously be configured as shown in the respective figures and described above. In this manner, debugging interface 430 can also be used to test the integration of hard logic blocks with soft logic modules.

Figure 5:
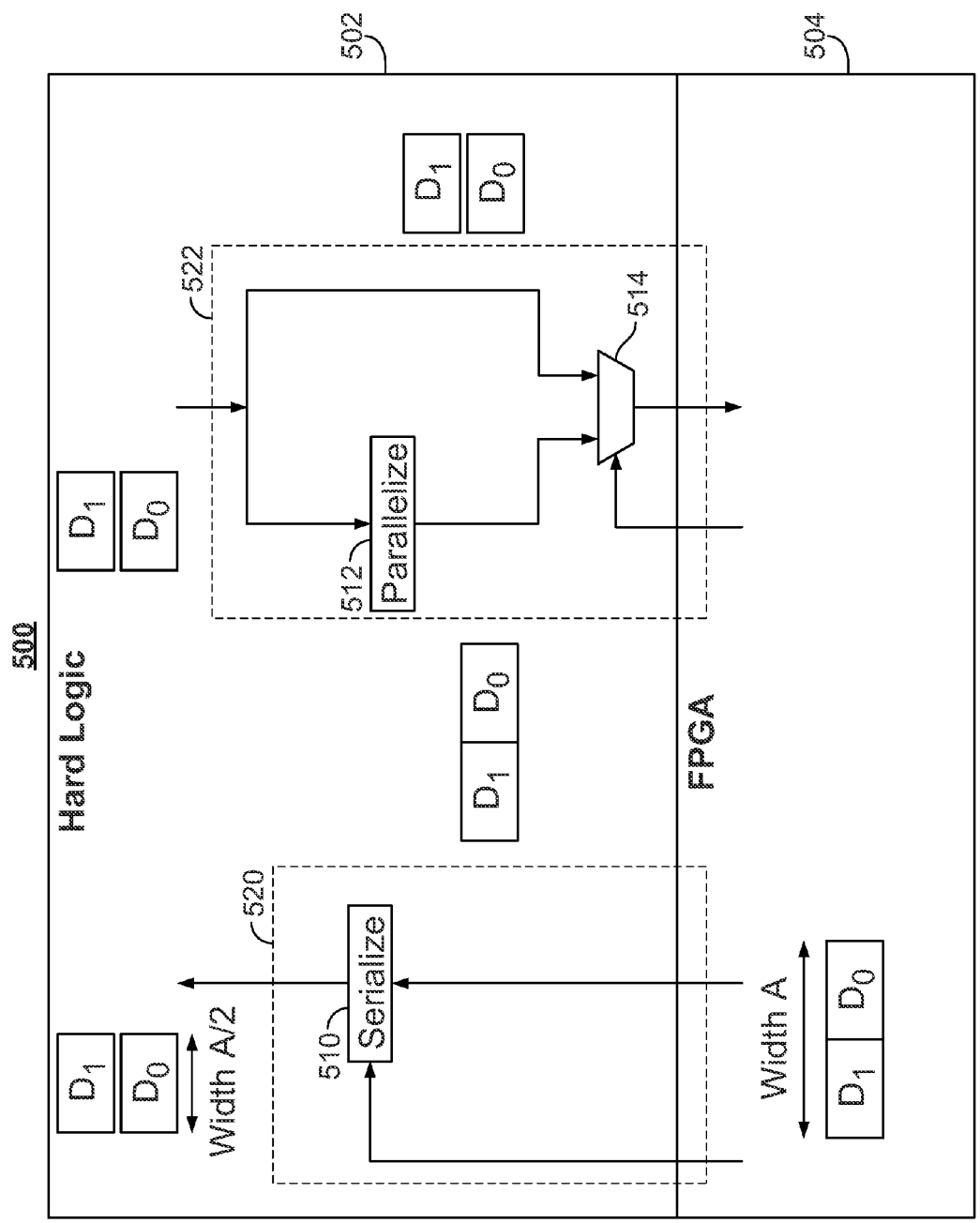
FIG. 5 depicts an exemplary implementation of configurable interconnects that couple hard logic to soft logic, according to an illustrative embodiment of the present invention.

FIG. 5 depicts an exemplary implementation of configurable interconnects that couple hard logic to soft logic, in accordance with some embodiments of the present invention. In particular, FIG. 5 shows illustrative interconnects 500, which may be substantially similar to any of interconnects 270-282 of FIG. 2. As shown, interconnects 500 include two separate interconnections 520 and 522 for routing data between FPGA fabric and hard logic. Interconnection 520 is used to route data from FPGA fabric 504 to hard logic 502, while interconnection 522 is used to route data from hard logic 502 to FPGA fabric 504. In some embodiments, the FPGA fabric operates at half the speed of the hard logic. Accordingly, when data is provided from FPGA fabric 504 to hard logic 502, two data words may be transmitted in parallel and then serialized in hard logic. The serializing may be performed on a bit level or on a word level. For instance, the two data words may be serialized on a word level in hard logic thereby providing the words to the hard logic blocks in serial fashion. Interconnection 520 may therefore include serializer circuitry 510 to serialize the two data words, as shown. Similarly, when data is provided from hard logic 502 to FPGA fabric 504, two data words may be parallelized in hard logic and then provided to the FPGA fabric. Interconnection 522 may therefore include parallelizer circuitry 512 to parallelize the two data words, as shown. In this manner, throughput is balanced between the faster hard logic and slower FPGA fabric.

Figure 6:
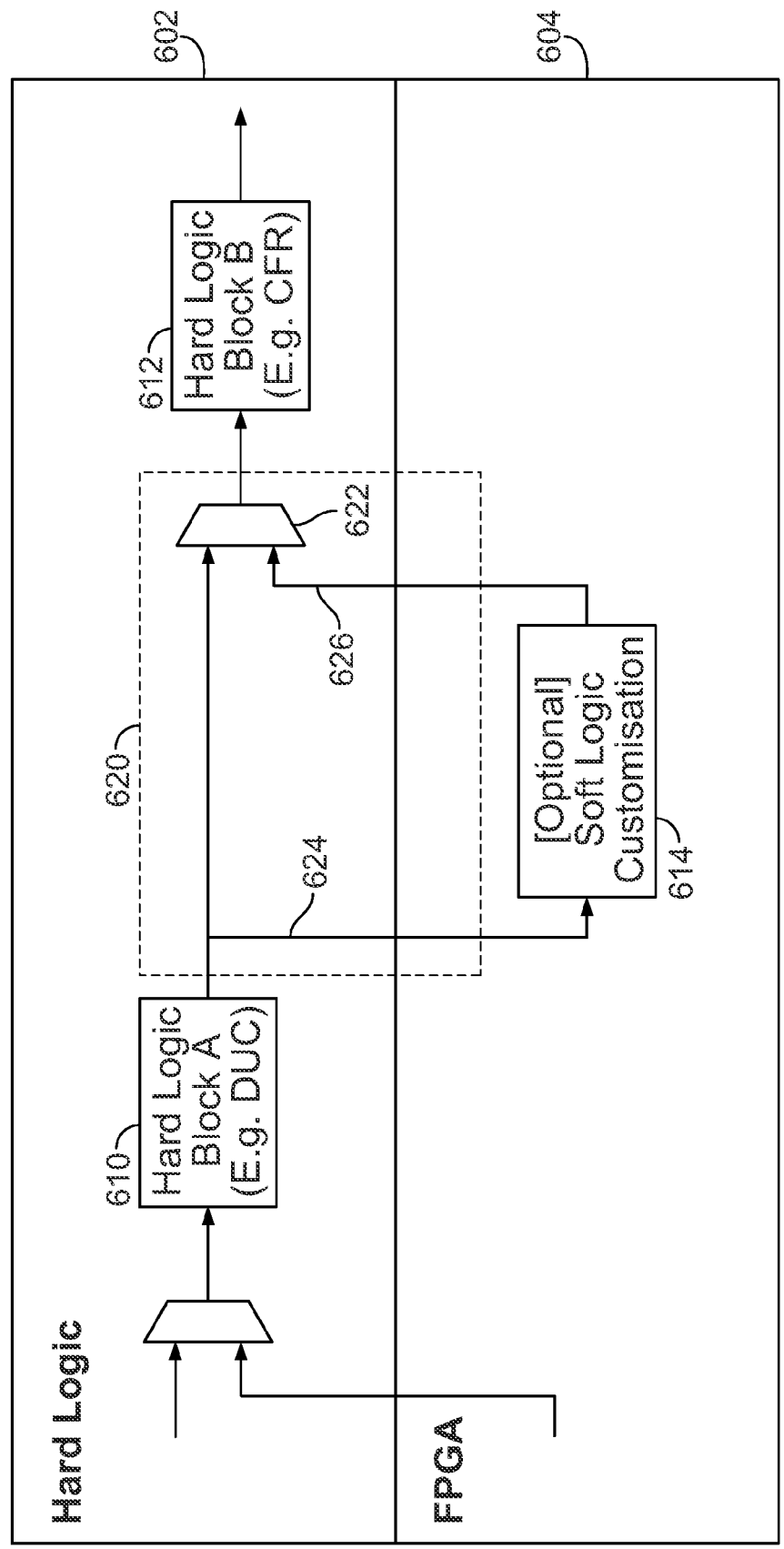
FIG. 6 depicts an exemplary implementation of configurable interconnects enabling the insertion of a soft logic module into a hard logic data path, according to an illustrative embodiment of the present invention.

FIG. 6 depicts an exemplary implementation of configurable interconnects enabling the insertion of a soft logic module into a hard logic data path, in accordance with some embodiments of the present invention. In particular, FIG. 6 shows illustrative interconnects 620, which may be substantially similar to any of interconnects 270-282 of FIG. 2. As shown, interconnects 620 route data signals between hard logic 602 to FPGA fabric 604. Interconnects 620 includes interconnect 624 for providing signals from hard logic to FPGA fabric, interconnect 626 for providing signals from FPGA fabric to hard logic, and multiplexer 622. Multiplexer 622 is configured to output one of a signal received from hard logic and a signal received from soft logic, depending on whether a soft logic module is to be added to the data path. For example, in order to insert soft logic module 614 into the hard logic data path, interconnect 624 routes the output of hard logic block 610 to soft logic module 614. Soft logic module 614 processes the signal and interconnect 626 routes the processed signal to multiplexer 622, which also receives the unprocessed output directly from logic block 610. Multiplexer 622 selects the signal provided by interconnect 626 in order to insert the soft logic module into the hard logic data path, and hard logic block 612 receives the processed signal. On the other hand, multiplexer 622 selects the signal provided by logic block 610 to bypass the soft logic module, in which case hard logic block 612 receives the unprocessed signal directly from block 610.

It should be understood that FIG. 6 is a simplified illustration, and that other suitable components may provide additional functionality. For instance, the serializer and parallelizer circuitry described in connection with FIG. 5 may be implemented to compensate for throughput limitations in the FPGA fabric. In addition, the circuitry of FIG. 6 may be augmented with additional circuitry enabling augmentation and/or replacement of a hard logic block, as shown in FIG. 7.

Figure 7:
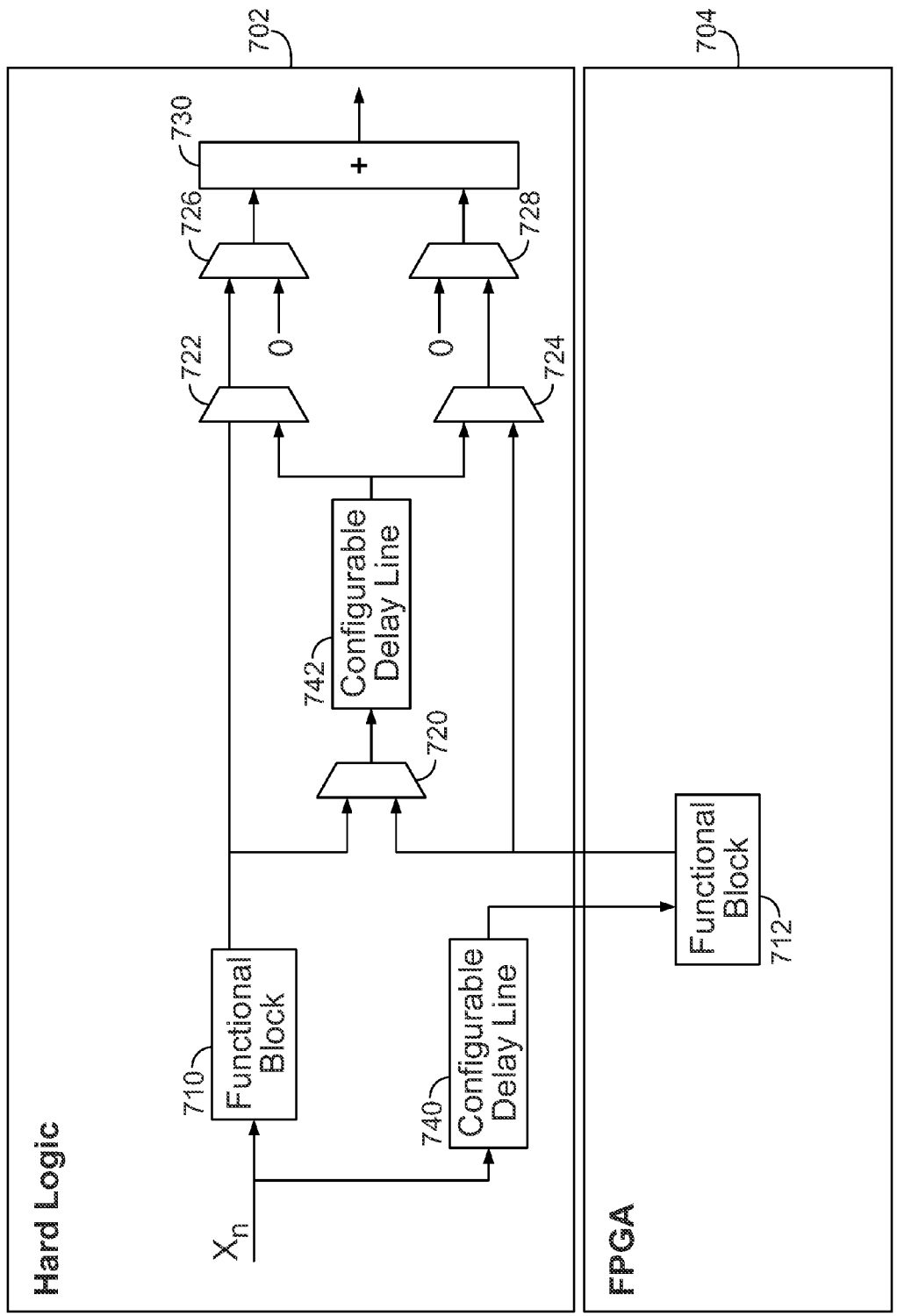
FIG. 7 depicts an exemplary implementation of configurable interconnects enabling the augmentation and/or replacement of a hard logic block, according to an illustrative embodiment of the present invention.

FIG. 7 depicts an exemplary implementation of configurable interconnects enabling the augmentation and/or replacement of a hard logic block, in accordance with some embodiments of the present invention. In particular, FIG. 7 shows hard logic portion 702 and FPGA fabric 704. Hard logic portion 702 may include hard logic block 710, multiplexers 720-728, combiner 730, and configurable delay lines 740 and 742. FPGA fabric 704 may include a soft logic module 712. As will be described, the depicted arrangement of components allows hard logic block 710 to be replaced by soft logic module 712, or for augmentation of the hard logic using soft logic module 712. In the latter approach, delay circuitry ensures compensation for any mismatch in processing speed between the hard logic and soft logic components.

When only the functionality provided by the hard logic block 710 is desired, multiplexers 720-728 may be configured to pass the output of hard logic block 710 directly to combiner 730, which may then output the signal as received. Specifically, the data signal output by block 710 is provided directly to multiplexer 722, which is configured to pass the data signal to multiplexer 726. Multiplexer 726 is likewise configured to pass the data signal to combiner 730, which combines (e.g., adds) a zero value output by multiplexer 728 to the data signal. In some approaches, it may be desirable to delay the data signal output by hard logic block 710 before it is output by combiner 730. In that case, multiplexer 722 is configured to pass through the data signal output by delay line 742, which is set to provide the desired amount of delay. Delay line 742 receives the data signal from hard logic block 710 through multiplexer 720, which is configured to pass through the data signal it receives from logic block 710.

When soft logic module 712 is to replace hard logic block 710, multiplexers 720-728 may be configured to pass the output of soft logic module 712 directly to combiner 730, which may then output the signal as received. Specifically, the data signal output by soft logic module 712 is provided directly to multiplexer 724, which is configured to pass the data signal to multiplexer 728. Multiplexer 728 is likewise configured to pass the data signal to combiner 730, which combines (e.g., adds) a zero value output by multiplexer 726 to the data signal. In some approaches, it may be desirable to delay the data signal output by soft logic module 712 before it is output by combiner 730. In that case, multiplexer 724 is configured to pass through the data signal output by delay line 742, which is set to provide the desired amount of delay. Delay line 742 receives the data signal from soft logic module 712 through multiplexer 720, which is configured to pass through the data signal it receives from soft logic module 712.

When hard logic block 710 is to be combined with soft logic module 712, multiplexers 720-728 may be configured to pass both the output of hard logic block 710 and the output of soft logic module 712 to combiner 730, which may then combine (e.g., add) the signals together, and output a combined signal. Specifically, when no delay is necessary, multiplexers 722 and 726 may pass the signal provided by block 710 directly to combiner 730. Similarly, multiplexers 724 and 728 may pass the signal provided by module 712 directly to combiner 730. When a delay is required for the hard logic signal (e.g., due to slower or lengthier processing in the FPGA), multiplexer 720 may provide the data signal from block 710 to delay line 742, which may delay the hard logic signal by the desired amount. Multiplexers 722 and 726 may then pass the delayed signal directly to combiner 730. Likewise, when a delay is required for the soft logic signal (e.g., due to slower or lengthier processing in the hard logic), multiplexer 720 may provide the data signal from module 712 to delay line 742, which may delay the soft logic signal by the desired amount. Multiplexers 724 and 728 may then pass the delayed signal directly to combiner 730.

It should be understood that the arrangement of FIG. 7 is illustrative only, and that one or more components may be removed or added as desired. For instance, multiplexers 720, 722, and 724 and delay line 742 may be removed, and delay line 740 may be used to delay a signal before it is received by module 712. Alternatively or additionally, delay line 740 may be removed altogether. Combiner circuitry 730 may be an adder, or any other circuitry suitable to combine two or more signal. Moreover, FIG. 7 may incorporate any of the components shown and described in connection with FIGS. 5 and 6.

Figure 8:
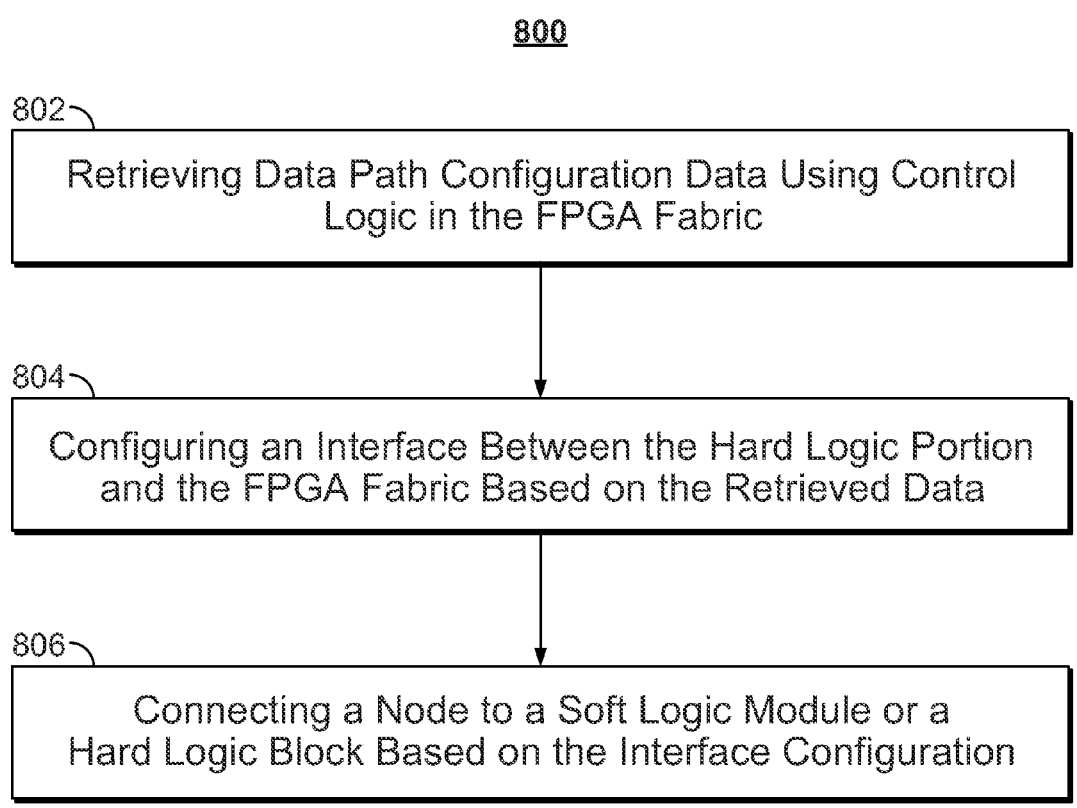
FIG. 8 is a flow chart of illustrative steps performed in connecting hard logic and soft logic using an interface, according to an illustrative embodiment of the present invention.

FIG. 8 shows illustrative process 800 for connecting hard logic and soft logic using an interface. At step 802, data path configuration data may be received, e.g., by control logic in the FPGA fabric. The data path configuration data may be stored in an external memory (e.g., memory 208 of FIG. 2) and retrieved by a memory access device in FPGA fabric (e.g., DMA 294 of FIG. 2). At step 804, the control logic may configure an interface between the hard logic portion and the FPGA fabric based on the retrieved configuration data. For example, control logic may configure any of interconnects 270-282 to bypass a hard logic block, replace a hard logic block with a soft logic module, insert a soft logic module into the data-path, or augment hard logic by routing in a signal from soft logic, as explained above. Accordingly, control logic may configure any of the components depicted and discussed in connection with FIGS. 5-7. Specifically, control logic may configure one or more multiplexers, serializer or parallelizer circuits, and/or delay lines. In other embodiments, the processor subsystem may configure these components instead of, or in addition to, the control logic. For instance, the processor subsystem may configure an interface between the hard logic portion and the FPGA fabric based on the retrieved configuration data.

At step 806, the interface may connect a node in the hard logic data-path (e.g., between two hard logic blocks or within a hard logic block) to a soft logic module or a hard logic block based on the configuration. For example, with reference to FIG. 6, the interface may connect the input of logic block 612 to the output of hard logic block 610 or soft logic module 614, depending on the configuration. As another example, with reference to FIG. 7, one or both of block 710 and module 712 may be connected to combiner 730. The configuration data is used by the control logic and/or processor subsystem in either circumstance to configure the multiplexers and/or delay lines as desired.

Figure 9:
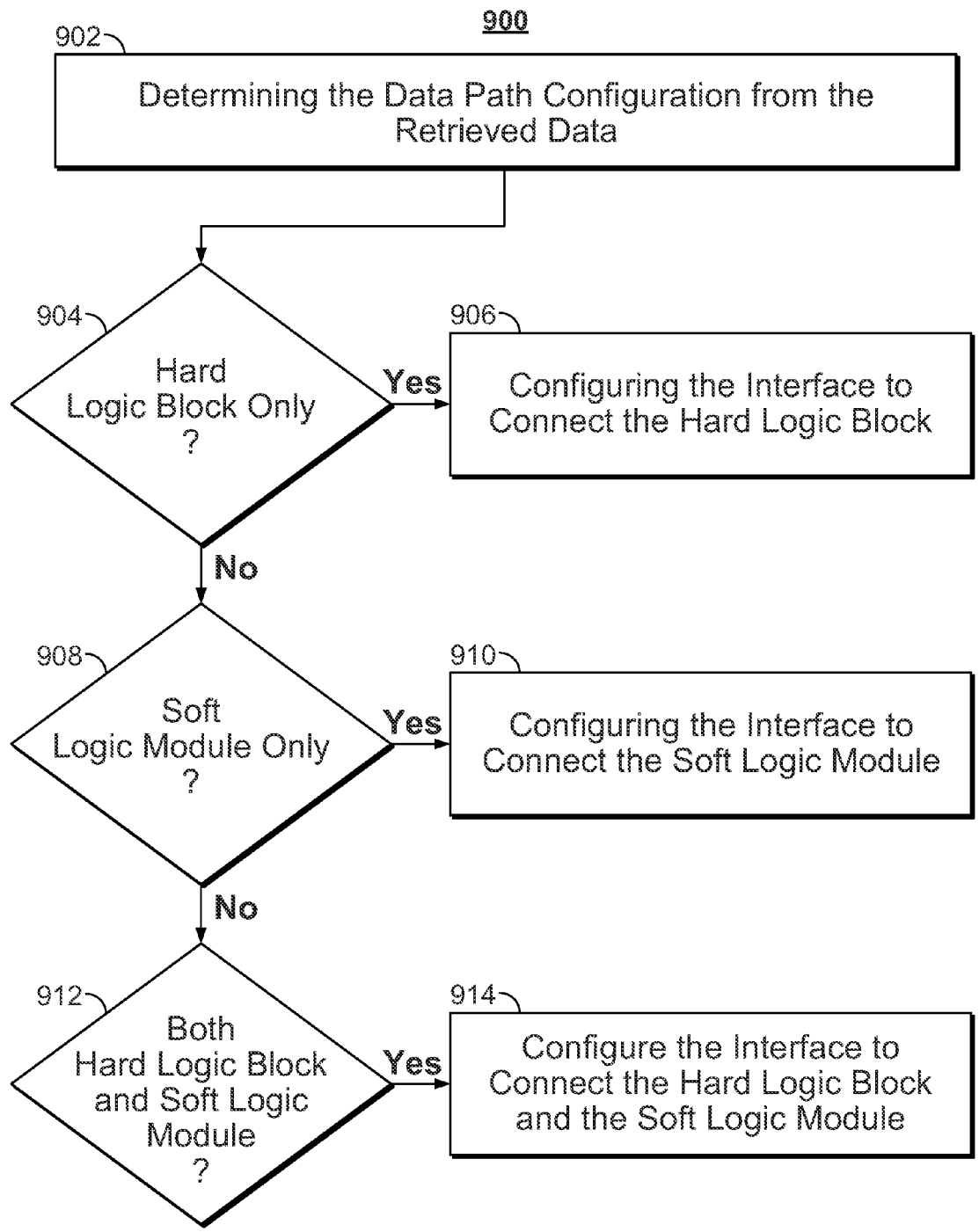
FIG. 9 is a flow chart of illustrative steps performed in configuring an interface between hard logic and soft logic, according to an illustrative embodiment of the present invention.

FIG. 9 shows illustrative process 900 for configuring an interface between hard logic and soft logic. Process 900 may be executed (e.g., by control logic and/or the processor subsystem) as part of step 804 of FIG. 8. At step 902, the data path configuration is determined from the data-path configuration data. That is, control logic and/or the processor subsystem reads the data form memory and determines which interconnects to configure and how they are to be configured. Specifically, steps 904-914 may be executed for each hard logic block of the hard logic chain. At step 904, the control logic and/or the processor subsystem determines whether a given hard logic block is to be used alone, i.e., without augmentation or replacement by a soft logic module. If so, the process proceeds to step 906 where the interface (e.g., the interconnects, multiplexers, and/or delay lines) are configured to connect the hard logic block to the data-path. At step 908, the control logic and/or the processor subsystem determines whether a given soft logic module is to be used alone, i.e., in place of a hard logic block. If so, the process proceeds to step 910 where the interface (e.g., the interconnects, multiplexers, and/or delay lines) are configured to connect the soft logic module to the data-path in place of the hard logic block. Finally, at step 912, the control logic and/or the processor subsystem determines whether a given hard logic block is to be used in combination with a soft logic module. If so, the process proceeds to step 914 where the interface (e.g., the interconnects, multiplexers, and/or delay lines) are configured to connect the hard logic block to the soft logic module. For example, by connecting the output of each block to a combiner circuit.

In practice, one or more steps shown in processes 800 and 900 may be combined with other steps, preformed in any suitable order, performed in parallel (e.g., simultaneously or substantially simultaneously), or removed. For example, the control logic and/or the processor subsystem may default to connecting all hard logic blocks unless it determines otherwise. Thus steps 904 and 906 may be removed and a hard logic block may only be replaced or augmented in response to determining such a configuration is desired from the configuration data. In some embodiments, the interface (e.g., the interconnects, multiplexers, and/or delay lines) are configured by the FPGA bit stream when the device is powered on. For instance, the multiplexers may be configured as part of the FPGA configuration routine using data stored in configuration memory (CRAM). Finally, processes 800 and/or 900 may be implemented using any suitable combination of hardware and/or software in any suitable fashion. For example, as discussed above, one or both of control logic in the FPGA fabric and the processor subsystem may configure the various hard logic blocks, soft logic modules, and interface connections. In embodiments in which the interface is configured by the FPGA bit stream when the device is powered on (e.g., using CRAM), control logic and the processor subsystem may or may not additionally configure the interface dynamically.

The above described embodiments of the present invention are presented for purposes of illustration and not of limitation, and the present invention is limited only by the claims which follow.

What is claimed is:

1. An integrated device comprising:
   a hard logic portion comprising a plurality of hard logic blocks, wherein a first of the hard logic blocks is configured to provide a first data signal;
   a field programmable gate array ("FPGA") fabric comprising control logic and a plurality of soft logic modules, wherein a first of the soft logic modules is configured to provide a second data signal; and
   an interface configured to route signals between the hard logic portion and the FPGA fabric, the interface comprising:
      a combiner circuit;
      a first multiplexer configured to provide one of the first data signal and a zero value signal to the combiner circuit; and
      a second multiplexer configured to provide one of the second data signal and the zero value signal to the combiner circuit;
      wherein the combiner circuit is configured to combine the signals provided by the first and second multiplexers and to output a combined signal;

wherein, responsive to a control signal from the control logic, the interface is further configured to selectively couple a first node in the hard logic portion to a node in the FPGA fabric.

2. The integrated device of claim 1, wherein the first node is an input to a second hard logic block of the plurality of hard logic blocks, and wherein the interface comprises a multiplexer disposed in the hard logic portion between the first and second hard logic blocks, the multiplexer configured to:
provide an output of the first soft logic module to the second hard logic block when the control signal has a first value; and
provide an output of the first hard logic block to the second hard logic block when the control signal has a second value.

3. The integrated device of claim 2, wherein the first soft logic module is configured to receive an input signal from the first hard logic block.

4. The integrated device of claim 2, wherein the first soft logic module and the first hard logic block are each configured to receive a same input signal, and wherein the control logic is configured to power off the first hard logic block when the output of the first soft logic module is selected for output by the multiplexer.

5. The integrated device of claim 1, wherein the interface comprises a plurality of multiplexers disposed in the hard logic portion, including the first and second multiplexers, and wherein:
the first multiplexer of the plurality of multiplexers is configured to provide one of the first data signal and the zero value signal to the combiner circuit based on the control signal; and
the second multiplexer of the plurality of multiplexers is configured to provide one of a second data signal and the zero value signal to the combiner circuit based on the control signal.

6. The integrated device of claim 5, wherein, responsive to determining that the first hard logic block is to be used alone:
the control logic configures the first multiplexer to provide the first data signal to the combiner circuit; and
the control logic configures the second multiplexer to provide the zero value signal to the combiner circuit;
wherein the combiner circuit is configured to combine the first data signal with the zero value signal.

7. The integrated device of claim 5, wherein, responsive to determining that the first soft logic module is to be used alone:
the control logic configures the first multiplexer to provide the zero value signal to the combiner circuit; and
the control logic configures the second multiplexer to provide the second data signal to the combiner circuit;
wherein the combiner circuit is configured to combine the zero value signal with the second data signal.

8. The integrated device of claim 5, wherein, responsive to determining that the first hard logic block and the first soft logic module are to be used together:
the control logic configures the first multiplexer to provide the first data signal to the combiner circuit; and
the control logic configures the second multiplexer to provide the second data signal to the combiner circuit;
wherein the combiner circuit is configured to combine the first data signal with the second data signal.

9. The integrated device of claim 5, wherein the interface further comprises a plurality of configurable delay lines disposed in the hard logic portion, and wherein:
a first configurable delay line of the plurality of configurable delay lines is configured to delay an input signal and to provide the delayed input signal to the first soft logic module;
a second configurable delay line of the plurality of configurable delay lines is configured to delay an output signal of a third multiplexer of the plurality of multiplexers, and to provide the delayed output signal to a fourth multiplexer of the plurality of multiplexers and to a fifth multiplexer of the plurality of multiplexers;
the third multiplexer is configured to provide one of the first data signal and the second data signal to the second configurable delay line based on the control signal;
the fourth multiplexer is configured to provide one of the first data signal and the delayed output signal to the first multiplexer based on a delay control signal; and
the fifth multiplexer is configured to provide one of the second data signal and the delayed output signal to the second multiplexer based on the delay control signal.

10. An integrated device comprising:
a hard logic portion comprising one or more hard logic blocks, wherein a first of the hard logic blocks is configured to provide a first data signal;
a field programmable gate array ("FPGA") fabric comprising configuration logic and one or more soft logic modules, wherein a first of the soft logic modules is configured to provide a second data signal;
a combiner circuit;
a first multiplexer configured to provide one of the first data signal and a zero value signal to the combiner circuit;
a second multiplexer configured to provide one of the second data signal and the zero value signal to the combiner circuit;
wherein the combiner circuit is configured to combine the signals provided by the first and second multiplexers and to output a combined signal; and
a configuration interface disposed in the hard logic portion and coupled to the one or more hard logic blocks, wherein the configuration interface is configured to provide configuration signals to the one or more hard logic blocks based on a data signal received from the configuration logic in the FPGA fabric.

11. The integrated device of claim 10 further comprising a processor subsystem comprising one or more microprocessor cores, wherein the configuration interface is further configured to provide the configuration signals to the one or more hard logic blocks based on a second data signal received from the processor subsystem.

12. The integrated device of claim 10 further comprising a debugging interface disposed in the hard logic portion, wherein the debugging interface is configured to insert and extract test signals in a data-path comprising the one or more hard logic blocks based on test data stored in an external memory, and wherein the external memory is accessed by a memory controller implemented in the FPGA fabric.

13. A method for interfacing between a hard logic portion and an FPGA fabric in an integrated device, the method comprising:
retrieving, from a memory, data path configuration data using control logic in the FPGA fabric;
configuring, with the control logic, an interface between the hard logic portion and the FPGA fabric based on the data path configuration data, wherein the configuring determines whether one or more hard logic blocks in the hard logic portion and whether one or more soft logic modules in the FPGA fabric are included in a data path;

coupling, with the interface, a node in the hard logic portion to one of a first soft logic module of the one or more soft logic modules and a first hard logic block of the one or more hard logic blocks based on the interface configuration;
determining, from the data path configuration data, whether the first hard logic block and the first soft logic module are to be used together; and
configuring the interface to couple the node in the hard logic portion to circuitry that combines an output of the first hard logic block and an output of the first soft logic module in response to determining that the first hard logic block and the first soft logic module are to be used together.

14. The method of claim 13 further comprising:
determining, from the data path configuration data, whether the first hard logic block is to be used alone; and
configuring the interface to couple the node in the hard logic portion to an output of the first hard logic block in response to determining that the first hard logic block is to be used alone, wherein an output of the first soft logic module is disconnected from the data path.

15. The method of claim 13 further comprising:
determining, from the data path configuration data, whether the first soft logic module is to be used alone;
configuring the interface to couple the node in the hard logic portion to an output of the first soft logic module in response to determining that the first soft logic module is to be used alone; and
powering off the first hard logic block.

16. The method of claim 13 further comprising:
delaying an output of the first hard logic block using a first configurable delay line, wherein the output is delayed in proportion to a relative throughput speed of the FPGA fabric; and
delaying an output of the first soft logic module using a second configurable delay line, wherein the output is delayed in proportion to a relative throughput speed of the first hard logic block.

17. The method of claim 13 further comprising:
receiving, with a configuration interface in the hard logic portion, configuration data from one of configuration logic implemented in the FPGA fabric and a processor subsystem; and
providing, with the configuration interface, a plurality of configuration signals to the one or more hard logic blocks based on the configuration data.

18. The method of claim 13, further comprising:
receiving, with a debugging interface in the hard logic portion, test data from external memory using a memory controller implemented in the FPGA fabric;
inserting, with the debugging interface, the test data at a first probe point in the hard logic portion;
extracting, with the debugging interface, debugging data at a second probe point in the hard logic portion; and
storing the extracted debugging data in the external memory using the memory controller.

19. The method of claim 13, wherein the interface comprises a plurality of available interconnections, the method further comprising:
determining whether one or more data path nodes in the hard logic portion are to be connected to the FPGA fabric based on the data path configuration data; and
selectively coupling the plurality of available interconnections to the one or more data path nodes in the hard logic portion based on the determination.

* * * * *